(12) United States Patent
Tao et al.

(10) Patent No.: US 7,514,789 B1
(45) Date of Patent: Apr. 7, 2009

(54) BALL GRID ARRAY PACKAGE-TO-BOARD INTERCONNECT CO-DESIGN APPARATUS

(75) Inventors: Yuming Tao, Kanata (CA); Jon M. Long, Livermore, CA (US); Anilkumar Raman Pannikkat, Mountain View, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 12/147,411

(22) Filed: Jun. 26, 2008

Related U.S. Application Data

(62) Division of application No. 11/292,685, filed on Dec. 1, 2005, now Pat. No. 7,405,477.

(51) Int. Cl.
*H01L 23/48* (2006.01)

(52) U.S. Cl. ...................................... 257/738; 257/659

(58) Field of Classification Search .................. 257/659, 257/738
See application file for complete search history.

(56) References Cited

U.S. PATENT DOCUMENTS

| 5,216,278 A | 6/1993 | Lin et al. |
| 5,796,589 A | 8/1998 | Barrow |
| 6,125,042 A | 9/2000 | Verdi et al. |

*Primary Examiner*—Douglas M Menz
(74) *Attorney, Agent, or Firm*—Weaver Austin Villeneuve & Sampson LLP

(57) ABSTRACT

A package-board co-design methodology preserves the signal integrity of high-speed signals passing from semiconductor packages to application PCBs. An optimal architecture of interconnects between package and PCB enhances the signal propagation, minimizes parasitic levels, and decreases electromagnetic interference from adjacent high frequency signals. The invention results in devices with superior signal quality and EMI shielding properties with enhanced capability for carrying data stream at multiple-gigabit per second bit-rates.

8 Claims, 5 Drawing Sheets

BALL GRID ARRAY PACKAGE-TO-BOARD INTERCONNECT CO-DESIGN APPARATUS

CROSS REFERENCE TO RELATED APPLICATION

This application is a divisional of prior application Ser. No. 11/292,685 filed on Dec. 1, 2005, now pending.

BACKGROUND OF THE INVENTION

1. Field of the Invention

The present invention relates to signal transition from ball grid array (BGA) packages to printed circuit board (PCB) intended for high-speed applications. More specifically, the present invention relates to package-board co-design methodology and optimal interconnect architecture between package and printed circuit board layers.

2. Description of Related Art

The ball grid array (BGA) package offers a number of advantages relative to other, older package types (e.g., quad flat pack (QFP) and pin grid array (PGA)), including small size, high input/output (I/O) pin count, improved electrical performance, low profiles, and good yields. The packages can be constructed with a substrate that can be either single or multi-layer. Substrates are fabricated with plastic or ceramic material, electrically conductive traces, and with planes being formed on a surface of each layer of the substrate. The surface of the substrate opposite from the semiconductor die or integrated circuit (IC) contains a plurality of solder balls that are soldered to the pads on a printed circuit board (PCB), thus attaching the package to the board. The semiconductor die is electrically connected to the substrate by either flip-chip (solder bump) interconnect or wire bonding. In both instances, the die is also generally encapsulated by plastic to protect it from the external environment.

One of the key benefits of BGA packaging is the increase of achievable I/O densities compared to older package options. Since BGA packaging places contacts over the entire surface of the chip instead of just around the edges, IC designers can place more I/Os in a given package size while using relatively looser tolerance compared to older peripheral lead types. This offers additional benefits to board designers who are not subsequently constrained to use the fine pitches that are typically necessary for older high-lead count packages. However BGA packaging brings new challenges to the packaging designers, particularly in high-speed IC applications, where the effects of electromagnetic interference (EMI) become extremely important, and BGA I/O densities exasperate this problem.

Signal integrity is another important issue for packages and boards emerging from high-speed transceivers in high-end FPGAs and ICs. Impedance control is critical for package-to-board transitions connecting signals from layer to layer. For example, there are two typical via transitions (via-to-pad) on packages connecting signal traces to board solder pads. These via configurations, the 'dog-bone' 120, and via-on-pad 122 configurations, are depicted in FIG. 1. On the board 100, if signal is routed on a top layer, the via-on-pad transition 122 is used and microstrip 123 will be deployed. If signal is routed in the inter-layer stripline 121, the 'dog-bone' via transition 120 is used. The via-transitions usually possess very low impedance due to the heavy parasitic capacitance found between a ball and the ground plane. Some package and board manufacturers propose an approach using a thicker substrate layer to reduce parasitic capacitance. This approach enlarges the package and board thickness and has been proved neither practical nor cost effective.

A high-speed BGA semiconductor device having improved electromagnetic interference (EMI) and signal integrity characteristics is desirable. Identifying a suitable electromagnetic shielding approach for use in BGA packaging is critical if the projected benefits of flip-chip technology, including improved EMI and flexible power/ground distribution, are to be fully achieved.

SUMMARY OF THE INVENTION

As a result of the emerging field of high-speed (e.g., multi-gigabit, such as 10+GB/s) FPGA and ICs, the package design and PCB design must not only to serve as device attachment platforms, but as an integral part of the IC. With the introduction of high I/O density package such as the BGA into high-speed devices, a top priority has been placed on package and board co-design, and as well as optimized interconnects between the package and the PCB.

The present invention provides a package-board co-design methodology that preserves the signal integrity of high-speed signals passing from semiconductor packages to application PCBs. The present invention further provides an architecture of interconnects between package and PCB that enhances the signal propagation, minimizes parasitic levels, and decreases electromagnetic interference from adjacent high frequency signals. The invention results in devices with superior signal quality and EMI shielding properties with enhanced capability for carrying data stream at multiple-gigabit per second bit-rates.

The BGA package-to-board co-design accomplishes routing signals from the semiconductor device package to the PCB, for example in high-speed FPGA and ICs and other applications. The co-design accounts for the via-to-BGA pad transition and BGA ball-to-PCB interconnection. The approach effectively takes packaging and PCB as an integral part of a high-speed integrated circuit design process and enables packaging and PCB designers to work interactively from packaging and board material selection and layer stack-up to signal routing and interconnection at and between the package and board The invention provides for an arrangement of signal ball pads, ground and/or power (ground/power) ball pads, and package footprints for attaching the solder pads on the PCB. With this arrangement, each signal or signal pair has a corresponding ground/power pad/via array isolating it from each other signal or signal pair, often in a coaxial-like format, thus providing the containment of electromagnetic waves and ensuring signal integrity of the BGA package-to-board interconnect. Also provided is an asymmetrical stripline as routing trace on the package that has a defined relationship to its referenced ground and/or power planes in the package and the board in order to control impedance; the spacing between a package reference plane and the asymmetrical stripline is at least half as much as the spacing between the asymmetrical stripline and a board reference plane.

An electromagnetic interference (EMI) shielding cavity is formed by solid ground/power planes, BGA balls, metal strips, and via array. Within this shielding cavity, a metal plane cut or clearance is enforced within the vicinity of a signal ball or balls in order to achieve the goals of parasitic capacitance reduction and impedance control. These efforts then enhance signal transmission, avoid reflection and radiation, and provide superior electromagnetic shielding.

The invention also allows the design of high-performance, multiple-gigabit per second capable IC packages made from low-cost organic material.

These and other features and advantages of the present invention are described below where reference to the drawings is made.

DETAILED DESCRIPTION OF SPECIFIC EMBODIMENTS

Figure 1:
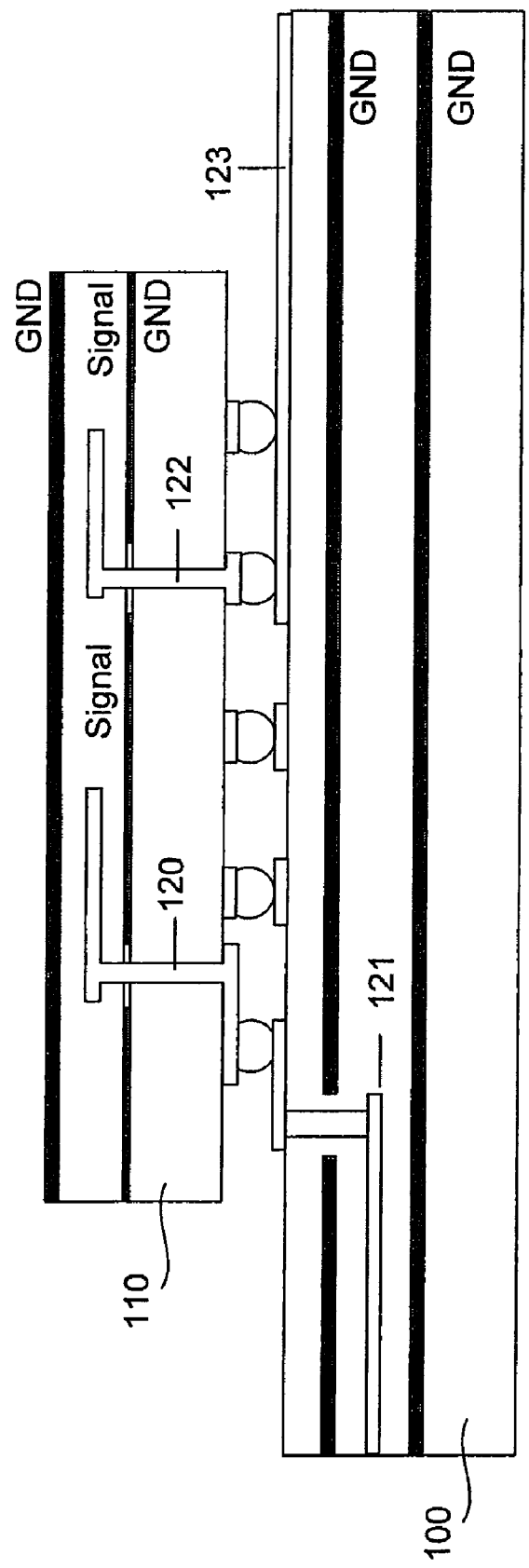
FIG. 1 illustrates two typical via-to-pad transitions connecting signal traces from a package to board solder pads.

Reference will now be made in detail to specific embodiments of the invention. Examples of the specific embodiments are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

Introduction

As a result of the emerging field of high-speed (e.g., multigigabit, such as 10+ GB/s) FPGA and ICs, the package design and PCB design must not only to serve as device attachment platforms, but as an integral part of the IC. With the introduction of high I/O density package such as the BGA into high-speed devices, a top priority has been placed on package and board co-design, and as well as optimized interconnects between the package and the PCB.

The present invention provides a package-board co-design methodology that preserves the signal integrity of high-speed signals passing from semiconductor packages to application PCBs. The present invention further provides an optimal architecture of interconnects between package and PCB that enhances the signal propagation, minimizes parasitic levels, and decrease electromagnetic interference from adjacent high frequency signals. The invention results in devices with superior signal quality and EMI shielding properties with enhanced capability for carrying data stream at multiple-gigabit per second bit-rates.

The BGA package-to-board co-design accomplishes routing signals from the semiconductor device package to the PCB, for example in high-speed FPGA and ICs and other applications. The co-design accounts for the via-to-BGA pad transition and BGA ball-to-PCB interconnection. The approach effectively takes packaging and PCB as an integral part of a high-speed integrated circuit design process and enables packaging and PCB designers to work interactively from packaging and board material selection and layer stack-up to signal routing and interconnection at and between the package and board The invention provides for an arrangement of signal ball pads, ground and/or power (ground/power) ball pads, and package footprints for attaching the solder pads on the PCB. With this arrangement, each signal or signal pair has a corresponding ground/power pad/via array, often in a coaxial-like format, that isolates it from each other signal or signal pair, thus providing the containment of electromagnetic waves and ensuring signal integrity of the BGA package-to-board interconnect. Also provided is an asymmetrical stripline as routing trace on the package that has a defined relationship to its referenced ground and/or power planes in the package and the board in order to control impedance; the spacing between a package reference plane and the asymmetrical stripline is at least half as much as the spacing between the asymmetrical stripline and a board reference plane.

An EMI shielding cavity is formed by solid ground/power planes, BGA balls, metal strips, and via array. Within this shielding cavity, metal plane cut or clearance is enforced within the vicinity of a signal ball or balls in order to achieve the goals of parasitic capacitance reduction and impedance control. These efforts then enhance signal transmission, avoid reflection and radiation, and provide superior electromagnetic shielding.

The invention also allows the design of high-performance, multiple-gigabit per second capable IC packages made from low-cost organic material.

Package Board Co-Designs

Figure 2A:
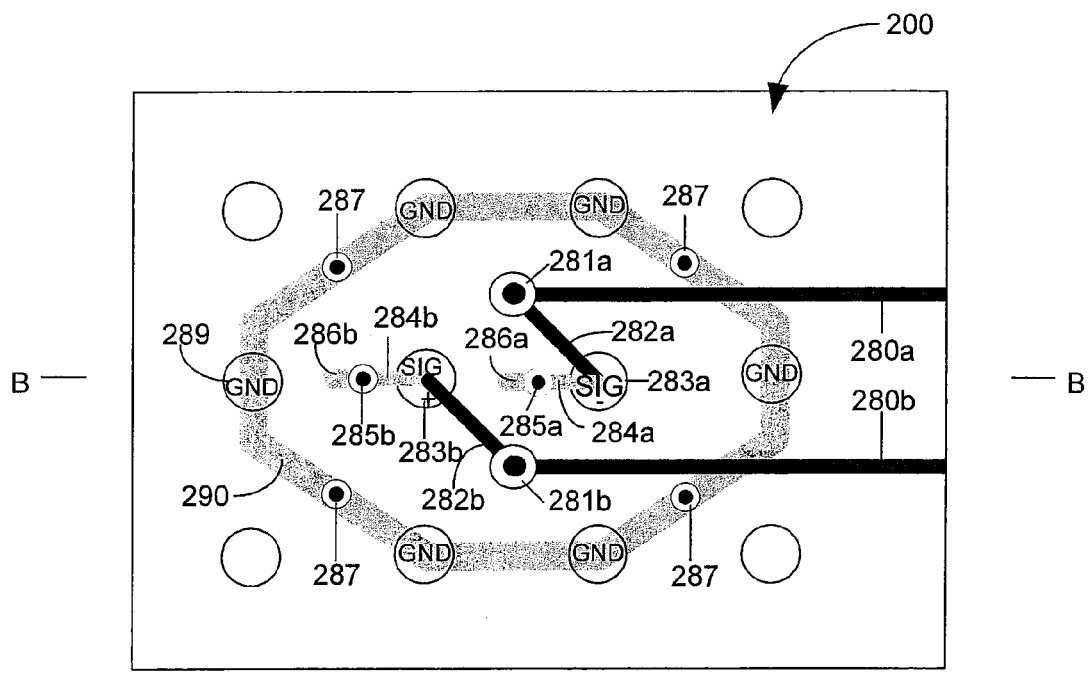
FIG. 2A is a top view of a BGA package-to-board interconnects according to an embodiment of the present invention.
Figure 2B:
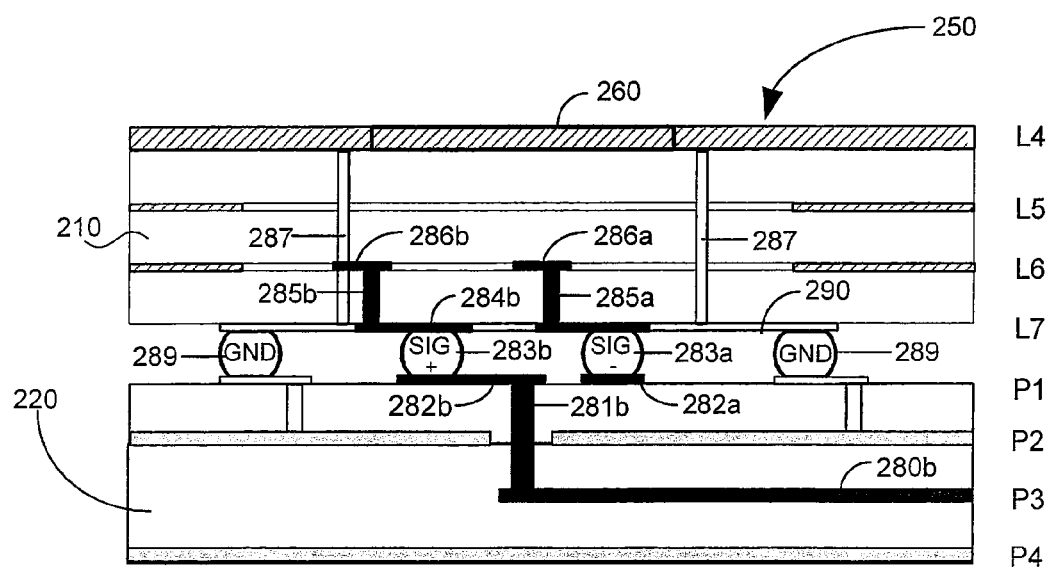
FIG. 2B is a cross-sectional side sectional view of the BGA package-to-board interconnects of FIG. 2A.

Referring to FIGS. 2A and B, an embodiment of the present invention, a type of BGA package-to-PCB interconnection 200 for high-speed applications, is shown. A top view of this interconnection 200 is depicted in FIG. 2A, and a cross-sectional side view along the B-B line shown in FIG. 2A is shown in FIG. 2B. In the top view of FIG. 2A, the interconnection 200 includes the metal connections 280*a*, 280*b*, 282*a*, 282*b*, 284*a*, 284*b*, 286*a*, and 286*b* for the signal routing from layer L6 of the package 210 to the signal intra-layer P3 of the PCB 220 as depicted in FIG. 2B. The cross-sectional view of FIG. 2B shows the bottom-half of the package substrate layers L4, L5, L6 and L7 and the printed circuit board top layers P1, P2, P3 and P4.

Referring to FIGS. 2A and B, metal plane cut or metal clearance is provided between conductive layers L5 and L7 with purpose of parasitic capacitance reduction on package side. To further reduce parasitic load on the signal balls, a metal removal 260 may be conducted on layer L4 or on other top layers on the package. Metal clearance under signal pads on the PCB may also be used to reduce parasitic capacitance (e.g., metal cut on ground layer P2). A virtual ground wall is created by two metal strips 290 sitting on the package bottom layer and the PCB top layer, the via array, and the BGA ball pads, which connect the grounded BGA balls 289 on the bottom layer of the package substrate and the top layer of the PCB. A plurality of vias are used to solidly connect the two strips to the ground planes on both the package and the PCB. This coaxial-like vertical transition virtual ground wall forms an electromagnetic interference (EMI) shielding cavity to achieve superior signal integrity for the transition from package to PCB.

Signal traces 286a and 286b are located on package layer L6. Signal traces 284a and 284b are located on package layer L7. Two vias 285a and 285b connecting the signal traces 286a and 286b to BGA balls 283a and 283b, respectively, are in a 'dog-bone' configuration. The vias 285a and 285b are located within the EMI shielding cavity. The signal traces 284a, 284b and 286a, 286b are routed as an asymmetrical stripline with two reference ground planes. In this embodiment, the bottom reference plane is on the first metal plane P2 on the PCB 220 while the top reference plane can be placed on any layer L4 or above of the package, on the package stiffener or the package lid. The trace width of the stripline varies with the distance between the two reference planes.

The use of an asymmetrical stripline format provides for controlled impedances for high-speed signal traces. As a general matter, the asymmetrical stripline as routing trace on the package has a defined relationship to its referenced ground planes in the package and the board in order to control impedance; the spacing between a package reference ground plane and the asymmetrical stripline is at least half as much as the spacing between the asymmetrical stripline and a board reference ground plane. For example, the ratio of the spacing between signal trace and top ground plane (in the package), to the spacing between signal trace and bottom grounded plane should be from about 0.5:1 to 4:1 (including any intermediate point, e.g., about 1:1, 2:1, 3:1, etc.). Such a configuration results in 50 ohm singled-ended or 100 ohm differential impedance of signal traces.

In this embodiment, two signal traces 282a and 282b on the top layer of the PCB 220, leading signal from balls 283a and 283b, respectively, are in a microstrip line with reference ground plane P2. These two signal traces are connected by vias 281a and 281b, respectively, down to a signal intra-layer P3 on the PCB, on which a coupled stripline pair 280a and 280b, respectively, are used primarily for signal routing on the PCB 220.

Although the stripline traces 280a and 280b are routed on PCB layer P3 with a top ground plane P2 and a bottom ground plane P4 on the PCB 220 in this specific embodiment, the signal traces can also be routed on any intra-layer in coupled stripline format or on the top or bottom layer in microstrip or co-planar waveguide format. The signal vias, 281a and 281b, are presented in blind-via structure but they are not so limited; the signal vias can be in a plated thru-hole via structure with long via-stubs. Where necessary, an optimization on via parameters (via, via-pad and anti-pad) can be performed. Also, the signal paths from traces 286a and 286b on the package to traces 280a and 280b on the PCB are not limited to the configuration shown in FIGS. 2A and B and can be in any shape as long as they are matched in controlled-impedance and electrical length.

Thus, the signal ball pair is placed inside a virtual EMI shielding cavity in octagon comprised of metal strips, grounded BGA balls and vias on both the package and the PCB. Of course, this cavity is not limited to an octagonal shape and can be in hexagonal shape or any other type, as described in connection with other embodiments below, for example. Similarly, the vias 287 connecting the strip to the package global ground plane are not limited to the locations as shown in FIGS. 2A and B, but can be placed elsewhere along the strip or at any place outside of the EMI cavity region.

The particular embodiment of FIGS. 2A and B illustrates a specific implementation of the general signal trace and vertical transition routing methodology of the present invention that enhances the signal propagation, reduces impedance mismatches and increases electromagnetic interference shielding for high frequency signals. Alternate embodiments and additional illustrations of aspects of the present invention are provided below.

Figure 3A:
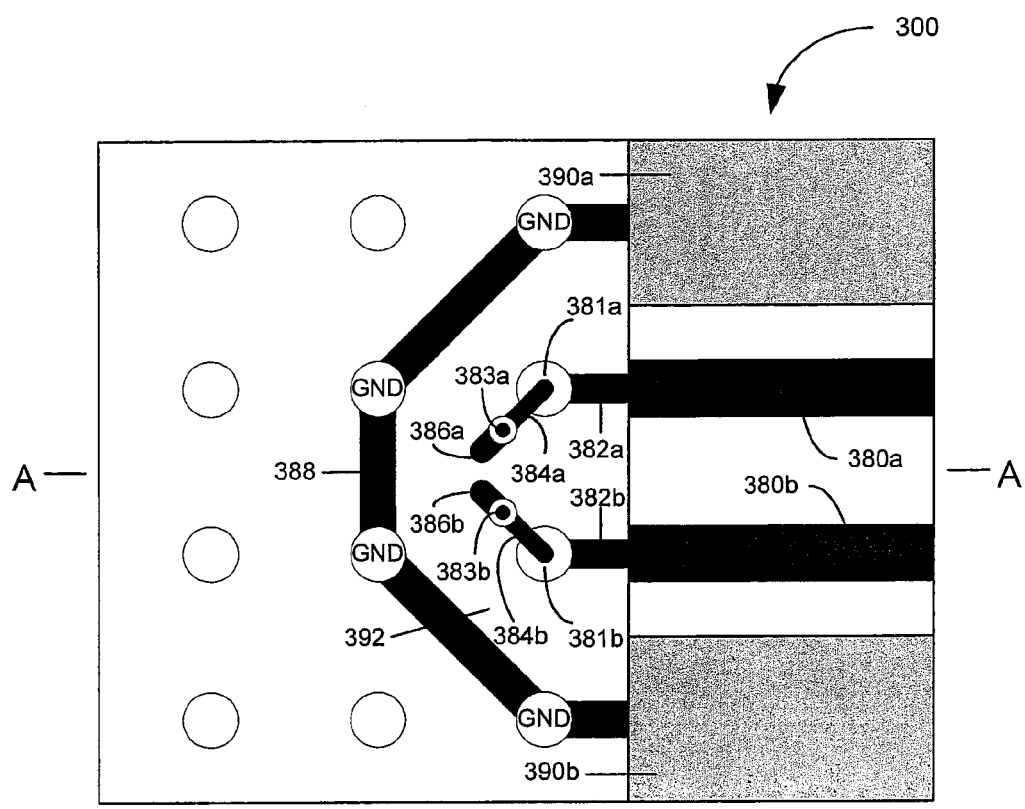
FIG. 3A is a top view of a BGA package-to-board interconnects according to another embodiment of the present invention.
Figure 3B:
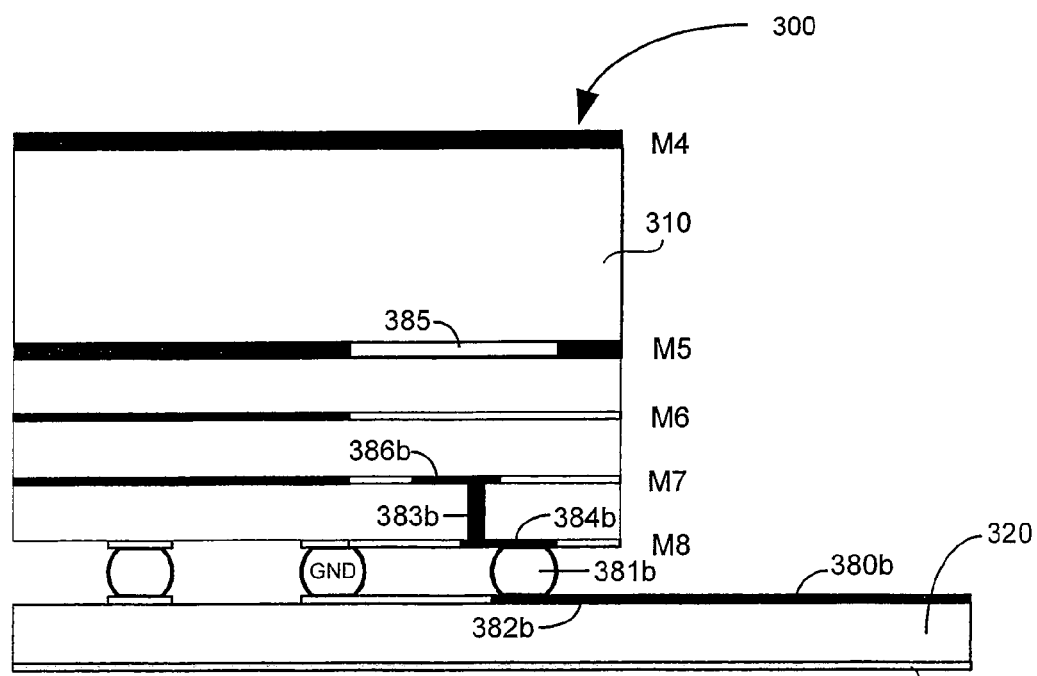
FIG. 3B is a cross-sectional side sectional view of the BGA package-to-board interconnects of FIG. 3A.

Referring now to FIGS. 3A and B, a second embodiment of a BGA package-to-PCB interconnection 300 in accordance with the present invention is illustrated. A top view of this interconnection 300 is depicted in FIG. 3A, and a cross-sectional side view along the A-A line shown in FIG. 3A is shown in FIG. 3B. In the top view of FIG. 3A, the interconnection 300 includes the metal connections 380a, 380b, 382a, 382b, 384a, 384b, 386a, and 386b for the signal routing from layer M7 on the package 310 to the top layer of the PCB 320. The cross-sectional view of FIG. 3B shows the bottom-half of the package substrate and printed circuit board top substrate layers. The signal connection from the solder bump, routing and vias on top substrate layers M1 to M7 is not shown.

Referring to FIGS. 3A and B, a metal plane cut or metal clearance is provided between conductive layers M5 and M7 with the purpose of reducing parasitic capacitance. This EMI shielding cavity 392 is provided by connecting all grounded balls to form metal strips 388 on the bottom layer M8 of the package substrate and the top layer of the PCB. A plurality of vias (GND) are placed to solidly connect the strip to the ground planes on both the package and the PCB to achieve superior signal integrity for the transition of ball-to-PCB. The signal traces 386a and 386b are located on layer M7. The signal traces 384a and 384b are located on layer M8. Two vias 383a and 383b connecting the signal traces 386a and 386b to BGA balls 381a and 381b, respectively, are in a 'dog-bone' configuration. The vias 383a and 383b are located within the EMI shielding cavity 392. The signal traces 384a, 384b and 386a, 386b are routed as an asymmetrical stripline with two reference ground planes. The bottom reference plane is on the first metal plane on the PCB 320 while the top reference plane can be placed on any layer above M4 (including M4) or package stiff frame or even package lid. However the trace width of stripline varies with the distance between this two reference planes. The use of an asymmetrical stripline format provides enhanced controlled impedances.

A conductor-backed ground coplanar waveguide is provided by the signal traces 380a and 380b, as well as grounded side strips 390a and 390b. The signal traces 380a and 380b and grounded side strips 390a and 390b are used primarily for signal routing on the PCB 320. As the extension part of the signal traces 380a, 380b, the traces 382a, 382b underneath the package substrate are routed in an asymmetrical stripline format and interconnected to signal traces 384a, 384b on the substrate layer through solder balls 381a, 381b. Asymmetric stripline traces, 384a, 384b, 386a, and 386b are routed on different substrate layers but sharing a common top ground plane on package layer M4 and a bottom ground plane 395 on the PCB 320.

As with the embodiment depicted in FIGS. 2A and B, the asymmetrical stripline as routing trace on the package 310 has a defined relationship to its referenced ground planes in the package and the board 320 in order to control impedance; the spacing between a package reference ground plane and the asymmetrical stripline is at least half as much as the spacing between the asymmetrical stripline and a board reference ground plane. For example, the ratio of the spacing between signal trace and top ground plane (in the package), to the spacing between signal trace and bottom grounded plane should be from about 0.5:1 to 4:1. Such a configuration results in 50 ohm singled-ended or 100 ohm differential impedance of signal traces.

According to this present invention, the signal traces 382a, 382b, 384a, 384b and 386a, 386b are routed in a controlled impedance transmission line, which could be a microstrip, stripline, or coplanar waveguide. While the signal traces 380a, 380b are routed in a conductor-backed ground coplanar waveguide in this embodiment of the invention they could be microstrip or stripline. Coaxial-like vertical transitions are also implemented in the BGA ball-to-PCB, and layer-to-layer transition. This routing methodology enhances the signal propagation, reduces impedance mismatches and increases electromagnetic interference shielding for high frequency signals.

In this embodiment, the signal ball pair is placed along the perimeter of package substrate and electrically isolated from other signal balls or signal ball pairs by being surrounded by the ground/power balls to form a shielding cavity completed by the perimeter. Of course, in other embodiments the signal ball pair can be placed anywhere on the package substrate in which it is either parallel to or perpendicular to or in 45° angle to the edge of substrate. In any case, signal traces 382a, 382b can be extended to carry signals from the package area toward traces 380a, 380b. The signal traces 382a, 382b are not limited to straight lines, as depicted in this embodiment, and can be lines of any shape as long as they are matched in electrical length.

With further regard to the EMI shielding aspect of the present invention, various pad and ball configurations are provided to electromagnetically isolate the signal balls or signal ball pairs of a BGA to better accommodate electrical connections between the BGA package and the PCB. These pad configurations can be placed as an individual or an array of various patterns. The virtual ground wall created, as described in greater detail above, forms a coaxial-like vertical transition virtual ground wall providing an EMI shielding cavity to achieve superior signal integrity for the transition from package to PCB. Specific implementations of these configurations are illustrated in FIGS. 4A and B.

Figure 4A:
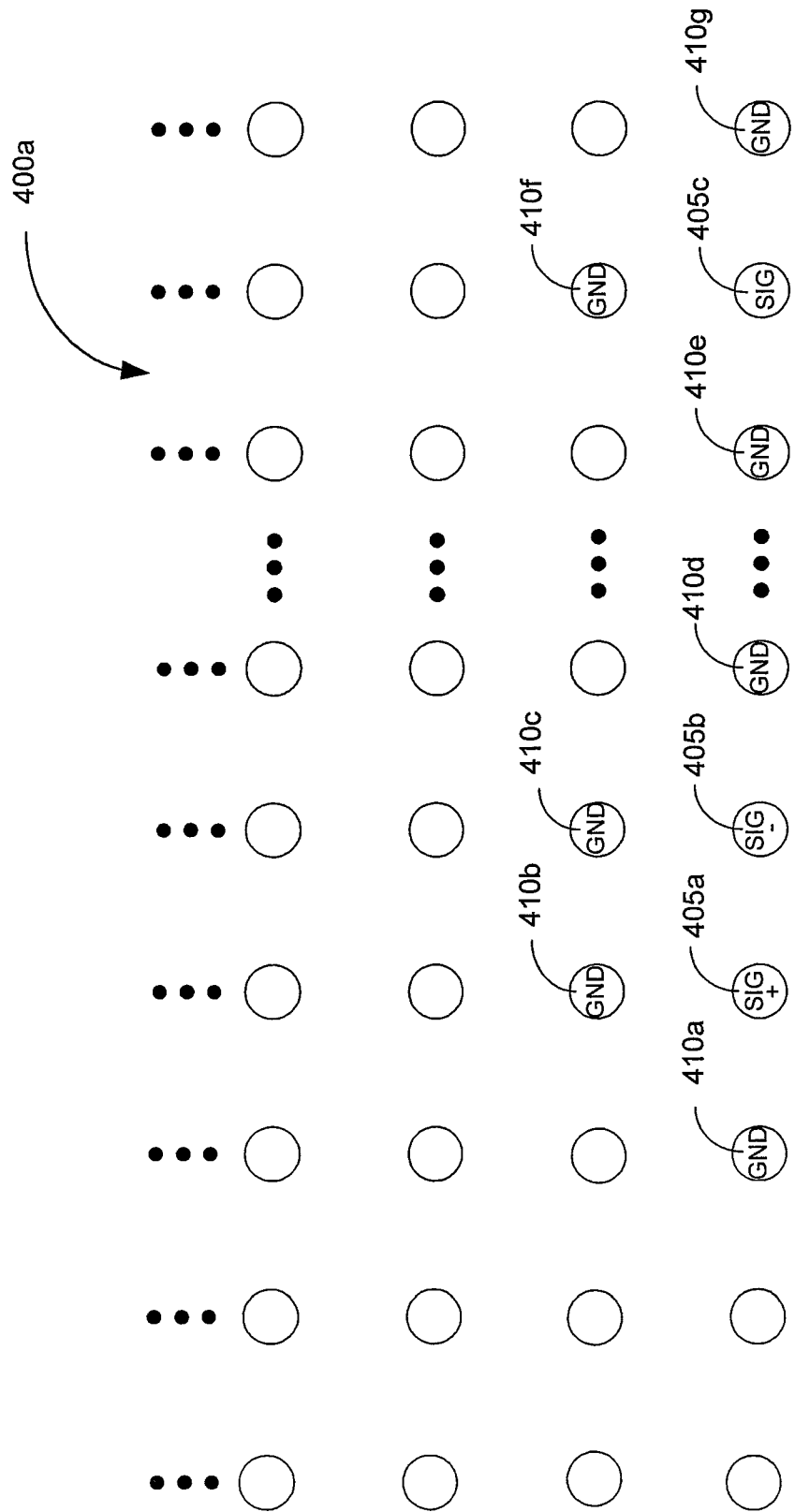
FIG. 4A a top view of BGA ball configuration for a high-speed signal application according to one embodiment of the present invention.

Referring to FIG. 4A, a first specific pad configuration in accordance with the invention is shown. The pad configuration is formed of a plurality of signal pads 405a, 405b, 405c, and ground mounting pads 410a, 410b, 410c, 410d, 410e, 410f, and 410g. The high-speed signal pads 405a, 405b, 405c are placed along the perimeter of the package substrate at layer (e.g., M7 or L8 of FIGS. 3A-B), or at the outermost portion of the PCB mounting pads (as this pad configuration is matched at the PCB mounting level). The signal pad pair 405a and 405b is surrounded by an array of grounded pads 410a, 410b, 410c, and 410d. The single signal pad 405c is surrounded by an array of grounded pads 410e, 410f, and 410g. This pad configuration 400a matches a configuration of signal balls and ground balls to form the interconnection between the package substrate and the PCB. The ground balls are connected together with metal traces to create a virtual ground wall. The virtual ground wall forms an EMI shielding for high-speed signals. In this preferred embodiment, the high-speed signal balls are not limited to placement along the peripheral of package substrate. They may be allocated at any placement as long as there is a plurality of ground balls surrounding and electromagnetically isolating the signal or signal pair.

Figure 4B:
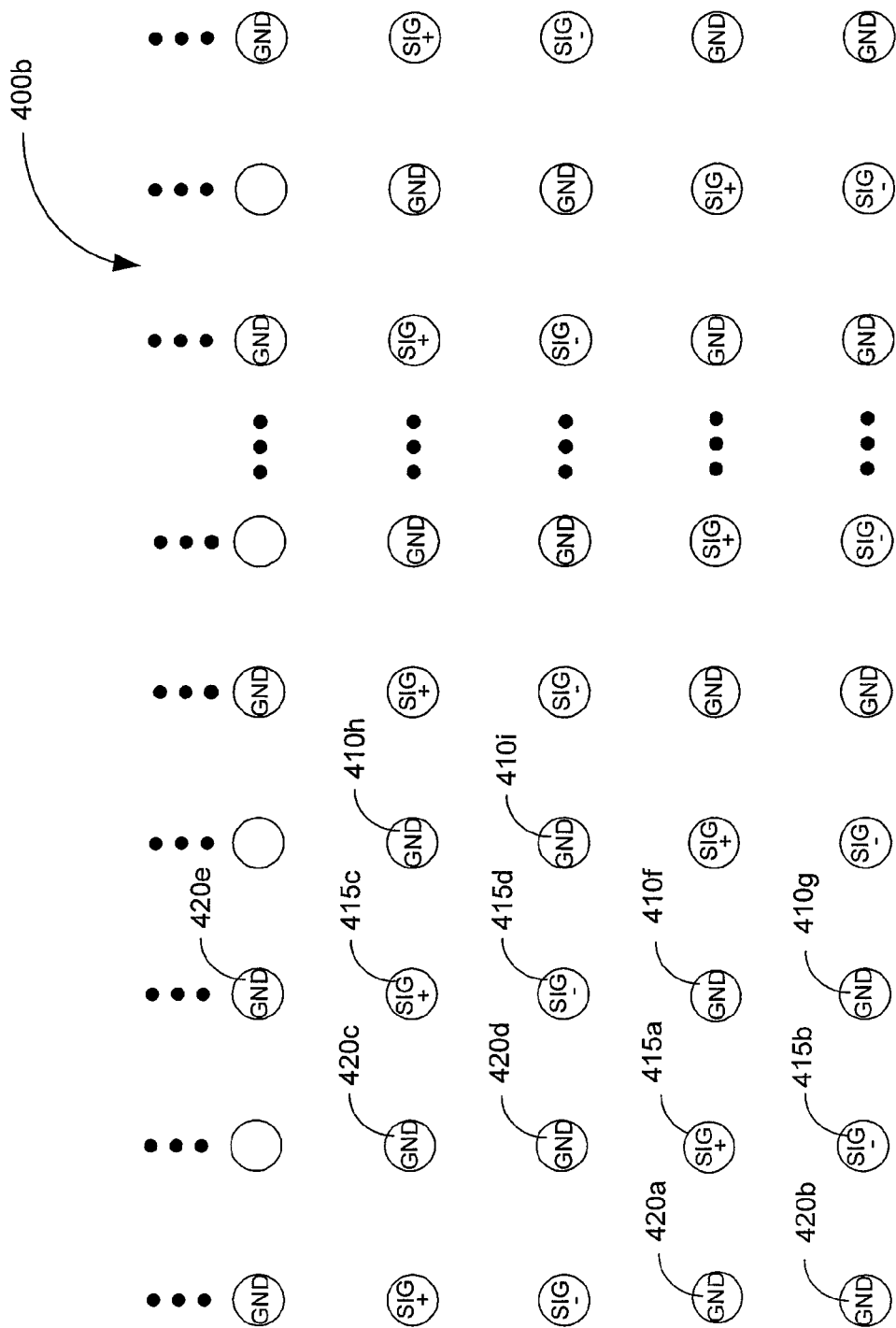
FIG. 4B a top view of BGA ball configuration for a high-speed signal application according to another embodiment of the present invention.

Referring to FIG. 4B, another specific pad configuration 400b having a hexagonal pattern, is shown. The pad configuration is formed of a first plurality of signal pads 415a, 415b, and ground mounting pads 420a, 420b, 420d, 420f, and 420g. The signal pad pair 415a and 415b is surrounded by an array of ground pads 420a, 420b, 420d, 420f, and 420g. Unlike the pad configuration 400a, the signal pad pair is perpendicular to the package substrate edge but placed at the two outermost rows of the pad array. A second plurality of signal pads 415c, 415d, and ground mounting pads 420c, 420d, 420e, 420f, 420h, and 410i is also provided. The signal pad pair 415c and 415d is surrounded by an array of ground pads 420c, 420d, 420e, 420f, 420h, and 410i. This signal pad pair is offset by one column to right and two rows up with respect to the first type of pad configuration. Two ground pads 420d and 420f are shared with this two neighboring signal pairs. These two pad organizations can be duplicated and a hexagonal pattern configuration of signal balls and ground balls is thus created to form the interconnection from the package substrate to the PCB. All ground balls would then be connected together with metal traces to create a virtual ground wall. The virtual ground wall forms an EMI shielding for high-speed signals. This hexagonal pattern pad configuration is not limited to the differential signal pair or pairs but also suitable for single-ended signal and signals.

The illustrated pad configurations in FIGS. 4A and B match configurations of signal balls and ground balls to form the interconnection between the package substrate and the PCB. The ground balls are connected together with metal traces to create a virtual ground wall thus formed as an EMI shielding for high-speed signals.

It should be noted that a ground ball can be replaced by a power ball, so that the ball may be a ground or power ball, or a combination of ground/power ball, to accomplish the present invention.

Alternative Embodiments

The present invention has been embodied in flip-chip BGA packaging applications. However, it is also applicable to a wire-bonding BGA. These two BGA packages share common attributes with the except for the die attachment formation on to the package surface. Although the optimized interconnect of BGA package-to-PCB is explained in the "dogbone" shaped via-to-ball transition structure, this present invention is also suitable for package-to-PCB interconnect using via-on-pad type of transition. The optimized signal transition and the creation of EMI shielding structure may also be utilized in multi-chip interconnections.

Furthermore, although the routing methodology has been explained in detail for an 8-layer flip-chip BGA package structure, as shown in FIGS. 2A-B and 3A-B, the methodology of this invention could be applied in BGA packages with any number of layers and also be extended to other types of packages.

Moreover, the present invention may be designed on a fully organic BGA package using organic material, or this concept can be extended to high-speed packaging made of any other material. The present invention can be utilized with any of other types of packaging and printed circuit board. In addition to high-speed data applications, the present invention also provides optimal routing methodology for high frequency semiconductor device package designs.

CONCLUSION

While this invention has been described in terms of a few preferred embodiments, it should not be limited to the specifics presented above. Many variations on the above-described preferred embodiments, may be employed. Therefore, the invention should be broadly interpreted with reference to the following claims.

What is claimed is:

1. An integrated circuit apparatus, comprising:
   a ball grid array semiconductor package, the package having a package substrate with a board interface layer having board signal traces and ground/power points;
   a printed circuit board comprising a package interface layer having package signal traces and ground/power points; and
   a ball grid array interconnecting the package and board, the ball grid array comprising one or more signal balls interconnecting the package and board signal traces and ground/power balls interconnecting the package and board ground/power points;
   wherein the ground/power balls of the ball grid array electromagnetically isolate the signal ball or signal ball pair of the ball grid array from other signal balls or signal ball pairs.

2. The apparatus of claim 1, wherein the ground/power balls are ground balls.

3. The apparatus of claim 1, wherein the ground/power balls are disposed about the signal ball or signal ball pair in a coaxial like format.

4. The apparatus of claim 3, wherein the ground/power balls are disposed about the signal ball or signal ball pair in a hexagonal or octagonal pattern.

5. The apparatus of claim 1, wherein the signal ball or signal ball pair are on a perimeter of the array and are electrically isolated from other signal balls or signal ball pairs by being surrounded by the ground/power balls to form a shielding cavity completed by the perimeter.

6. The apparatus of claim 1, wherein a single signal ball is surrounded by ground/power balls.

7. The apparatus of claim 1, wherein a pair of signal balls is surrounded by ground/power balls.

8. The apparatus of claim 1, wherein a 50 ohm singled-ended or 100 ohm differential impedance of signal traces results.

* * * * *